US007956669B2

(12) United States Patent
Chuang et al.

(10) Patent No.: US 7,956,669 B2
(45) Date of Patent: Jun. 7, 2011

(54) HIGH-DENSITY LOW-POWER DATA RETENTION POWER GATING WITH DOUBLE-GATE DEVICES

(75) Inventors: Ching-Te K. Chuang, South Salem, NY (US); Koushik K. Das, Yorktown Heights, NY (US); Keunwoo Kim, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 117 days.

(21) Appl. No.: 11/106,913

(22) Filed: Apr. 15, 2005

(65) Prior Publication Data
US 2006/0232321 A1 Oct. 19, 2006

(51) Int. Cl.
*H03K 17/687* (2006.01)
(52) U.S. Cl. .................................... 327/427; 327/534
(58) Field of Classification Search .................. 327/389, 327/427, 429, 434, 442, 534, 535, 537; 365/185.01, 365/185.1, 185.16; 326/81–83
See application file for complete search history.

(56) References Cited

U.S. PATENT DOCUMENTS

| 4,611,184 | A  | * | 9/1986  | Kumar .......................... 333/100 |
| 4,871,982 | A  | * | 10/1989 | Williams et al. ................. 331/75 |
| 5,701,017 | A  | * | 12/1997 | Patel et al. ....................... 257/27 |
| 5,786,724 | A  | * | 7/1998  | Teggatz .......................... 327/534 |
| 6,307,421 | B1 | * | 10/2001 | Kawano et al. ................. 327/398 |
| 6,359,498 | B1 | * | 3/2002  | Kurihara et al. ................ 327/513 |
| 6,912,150 | B2 | * | 6/2005  | Portman et al. ................ 365/149 |
| 6,933,744 | B2 | * | 8/2005  | Das et al. .......................... 326/17 |
| 6,947,325 | B2 | * | 9/2005  | Kaneda .................... 365/185.14 |
| 2001/0013806 | A1 | * | 8/2001 | Notani ............................ 327/534 |

OTHER PUBLICATIONS

Nowak et al, "Turning Silicon on its Edge," IEEE Circuits & Devices Magazine, pp. 20-31, Jan./Feb. 2004.*
Zhang et ai, "A 3-GHz 70Mb SRAM in 65nm CMOS Technology with Integrated Column-Based Dynamic Power Supply," 2005 IEEE International Solid State Circuits Conference, Session 26/Non\-Volatile Memory, pp. 474-475 (2005).*
T. Sakurai, "Low power digital circuit design," ESSCIRC, pp. 11-18, Sep. 2004.
S. Kim, et al, "Experimental measurement of a novel power gating structure with intermediate power saving mode," ISLPED, pp. 20-25, Aug. 2004.
E. Nowak, et al., "Turning Silicon on its edge", IEEE Circuits Devices Mag., pp. 20-31, Jan./Feb. 2004.
M. -. H. Chiang, et al., "Novel high-density low-power high-performance double-gate logic techniques", Proc. IEEE Int. SOI Conf., pp. 122-123, Oct. 2004.
K. W. Guarini et al, "Triple-self aligned, planar double-gate MOSFETs: devices and circuits," IEDM, pp. 425-428, Dec. 2001.
Y. Liu et al, A highly threshold voltage-controllable 4T FinFET with an 8.5-nm-thick Si-Fin channel, IEEE Elec. Dev. Lett., pp. 510-512, Jul. 2004.
Taurs-MEDICI, Synopsis, Inc., 2003.
Y. Taur and T. H. Ning, Fundamentals of modern VLSI devices, New York: Cambridge University Press, 1998.
K. Kim et al, Nanoscale CMOS circuit leakage power reduction by double-gate device, ISLPED, pp. 102-107, Aug. 2004.
S. Narendra et al, "Scaling of stack effect and its application for leakage reduction", ISLPED, pp. 195-200, Aug. 2001.

* cited by examiner

*Primary Examiner* — Lincoln Donovan
*Assistant Examiner* — Diana J Cheng
(74) *Attorney, Agent, or Firm* — Ryan, Mason & Lewis, LLP

(57) ABSTRACT

A new power gating structure with robust data retention capability using only one single double-gate device to provide both power gating switch and virtual supply/ground diode clamp functions. The scheme reduces the transistor count, area, and capacitance of the power gating structure, thus improving circuit performance, power, and leakage. The scheme is compared with the conventional power gating structure via mixed-mode physics-based two-dimensional numerical simulations. Analysis of virtual supply/ground bounce for the proposed scheme is also presented.

16 Claims, 11 Drawing Sheets

HIGH-DENSITY LOW-POWER DATA RETENTION POWER GATING WITH DOUBLE-GATE DEVICES

This invention was made Government support under Contract No. NBCH3039004 awarded by DARPA. The Government has certain rights in this invention.

FIELD OF THE INVENTION

The present invention generally relates to a method for data generation with systematic modeling.

BACKGROUND OF THE INVENTION

Numerals presented herebelow in square brackets—[ ]—are keyed to the list of references found towards the close of the present disclosure.

Initial reference is made to prior art in FIGS. 1(a), (b) and (c). It is generally known that the leakage power consumption of VLSI logic and memories increases rapidly with CMOS technology scaling. One way to reduce the power is to cut off the power line in standby mode when the circuit is not operating [1]. However, such a power gating structure (FIG. 1(a)) is not widely used in latches and other memory elements since the stored data information is completely lost when the power switch is off, and data recovery process significantly degrades system performance [3]. To solve this problem, a diode (FIG. 1(b)) or a transistor (FIG. 1(c)) can be put in parallel with the power gating device to serve as a clamping device for the virtual supply/ground rail, thus maintaining adequate voltage across the memory elements for state retention in standby mode. However, this extra clamping device increases the area and capacitance of the power gating structure, thereby degrading performance, power and leakage.

Reference is also made to prior art in FIG. 2 where a double gating arrangement comprising two gates is used in AGC (Automatic Gain Control) circuit [2]. In this prior art arrangement, both gates are on the same side of the silicon conducting channel in a conventional planar CMOS device structure. The two gates are in series with the first gate performing the AGC function while the second gate receives the input high frequency signals to be amplified. Both gates function simultaneously such that the high frequency input signal is amplified with a controllable and variable gain.

Double-gate (DG) technology is emerging as a potential candidate beyond 45 nm node technologies due to its distinct advantages for scaling to very short-channel lengths [4]. Furthermore, DG devices offer the unique opportunities for operating two (tied) gates simultaneously or independently controlling each gate [5]. For an independently controlled symmetrical DG device, each gate is decoupled and independently accessed/biased, and a single DG device acts as two parallel transistors [5]. Generally, an evolving need has been recognized in connection with effectively employing DG technology to help overcome the shortcomings and disadvantages of prior efforts as just described.

In the present invention, a symmetrical double-gate device is configured in a double-gating arrangement to provide improved data retention capability in power-gating structure. There are several distinctions from the AGC double-gating prior art in terms of device structures, configurations, operations, and intended use. For device structure, the two gates are on opposite sides of the silicon conducting channel in a symmetrical double-gate device structure, while the AGC circuit employs two gates on the same side of the silicon conducting channel in a conventional planar CMOS device structure. The two-gates are configured in "parallel" (as opposed to "series" configuration in AGC prior art), with the first gate configured to perform the power switch function, while the second gate is configured to serve as a clamping diode. When the power switch (first gate) is "On", the clamping diode (second gate) is bypassed (or disabled), thus maintaining the circuit performance. When the power switch is "Off", the clamping diode kicks in (becomes functional) to clamp the virtual power supply rail, thus improving the data retention capability of data storage elements while containing the leakage. As such, the two gates provide the desired functions in a complementary manner (not "simultaneously"). On the other hand, in the AGC double-gating prior art, both gates have to be "On" simultaneously to perform the desired function.

SUMMARY OF THE INVENTION

Generally, in accordance with at least one presently preferred embodiment of the present invention, there is broadly contemplated herein a novel power-gating structure using a single DG device to provide both power switch and virtual supply/ground diode clamp functions. The performance, power, and leakage of the scheme are compared herein with conventional power gating schemes with and without a diode clamp. The virtual supply/ground bounce is also analyzed herein.

In summary, one aspect of the invention provides an apparatus for providing power gating, the apparatus comprising: a double gating arrangement comprising two gates; a first of the two gates being configured to perform a power switch function; a second of the two gates being configured to perform a function independent of the power switch function.

Furthermore, an additional aspect of the invention provides a method for providing power gating, the method comprising the steps of: providing a double gating arrangement comprising two gates; performing a power switch function with a first of the two gates to perform a power switch function; performing a function independent of the power switch function with the second of the two gates.

For a better understanding of the present invention, together with other and further features and advantages thereof, reference is made to the following description, taken in conjunction with the accompanying drawings, and the scope of the invention will be pointed out in the appended claims.

DESCRIPTION OF THE PREFERRED EMBODIMENTS

Figure 1:
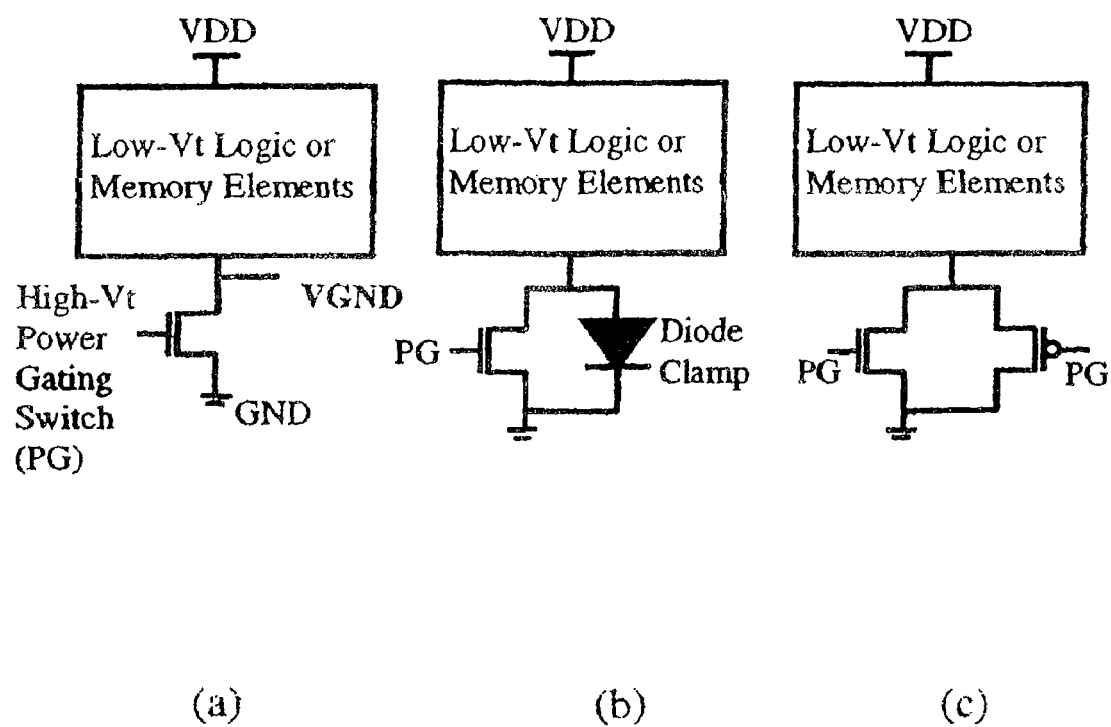
FIGS. 1 (a), (b), and (c) show prior arts of conventional (footer-based) power gating structures.
Figure 2:
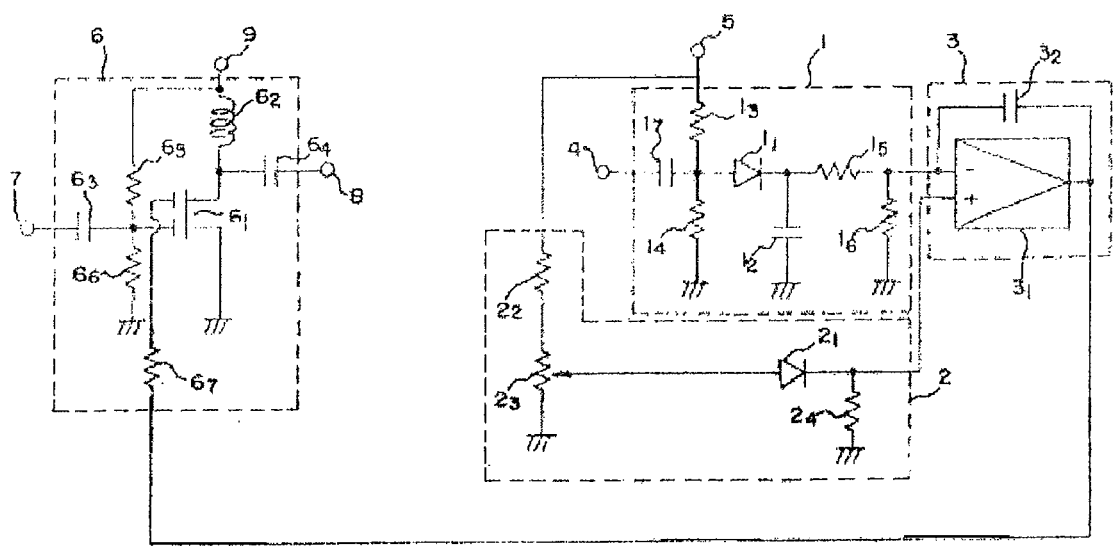
FIG. 2 shows the AGC circuit (prior art) [2].

As mentioned above, FIGS. 1 (a), (b), and (c) show prior arts of conventional (footer-based) power gating structures. In the most primitive form (FIG. 1(a)), the power line is cut off by an nFET power switch. The virtual ground (VGND) is left floating when the power switch device is off during the sleep/standby mode. As the virtual ground is charged up by the leakage, it gradually drifts to higher voltage, thus squeezing the voltage across memory elements and resulting in loss of stored data. By putting an extra diode (FIG. 1(b)) or a pFET (FIG. 1(c)) as clamping device, the voltage level of virtual GND is prevented from rising too high and adequate voltage is maintained across the memory elements. However, in addition to the extra leakage current path through the clamping device, the area and capacitance of the power gating structure are increased, thereby degrading the performance and power. Furthermore, for power gating structures with complementary CMOS devices (FIG. 1(c)), additional timing considerations are needed to properly hold the data.

Figure 3:
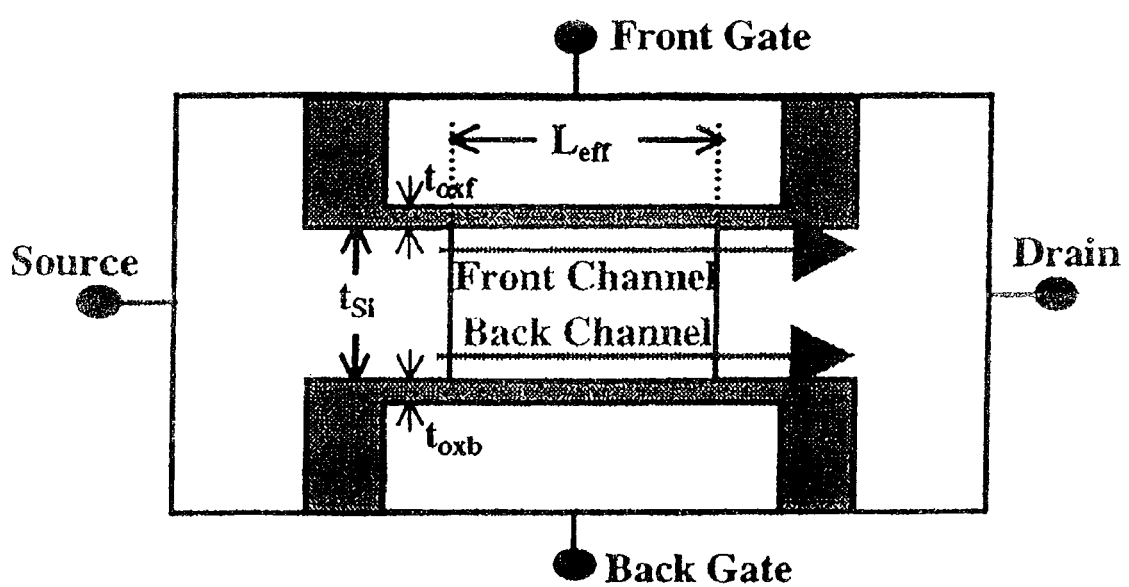
FIG. 3 schematically illustrates a 4-terminal DG device.

In contrast, in accordance with at least one presently preferred embodiment of the present invention, two independent gates of a single DG device are exploited, using one gate as a power switch and the other as a MOS clamping diode. FIG. 3 shows the schematics of a 4-terminal DG device in accordance with an embodiment of the present invention; conceivably, it can be either a planar DG device structure [6] or a FinFET structure [7], or any of a wide variety of alternative analogous structures. As illustrated, the front-gate and back-gate of a DG device can be independently controlled, wherein one gate is tied to virtual GND or VDD, acting as a diode, and the other gate acts as a power switch.

Figure 4:
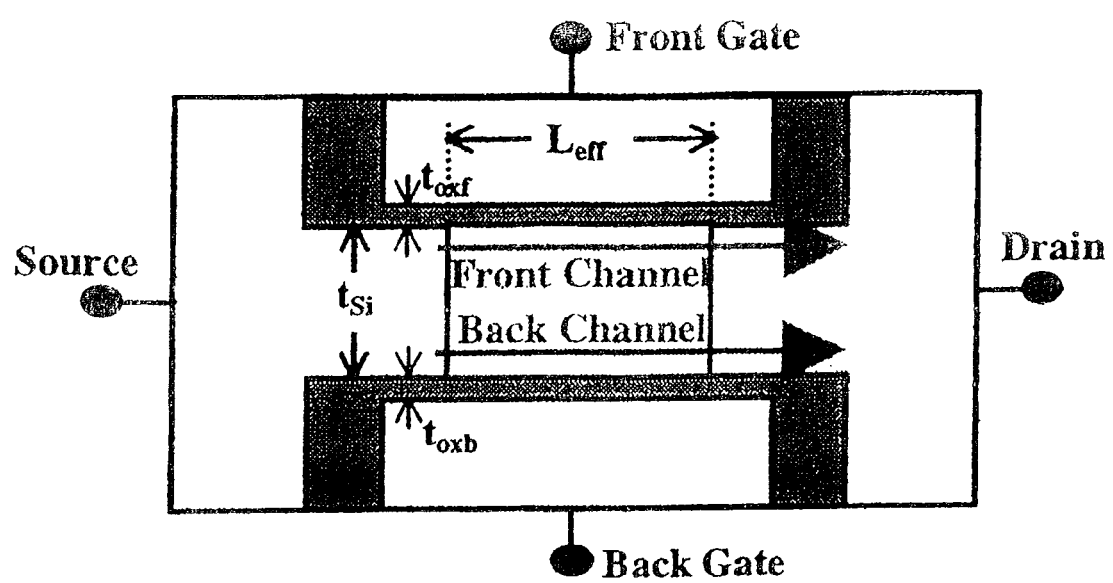
FIG. 4 illustrates a power gating structure in accordance with an embodiment of the present invention.

FIG. 4 more generally illustrates a proposed power gating structure in accordance with an embodiment of the present invention. Again, a single DG device provides both the power switch and virtual VDD/GND clamping functions to improve data retention capability in sleep/standby mode, thus reducing leakage and minimizing the area/capacitance penalty to improve the performance and power.

By way of a numerical simulation, in order to demonstrate the advantage of a novel 1T DG power gating structure in accordance with at least one embodiment of the present invention, Taurus-MEDICI was utilized in mixed-mode device/circuit simulations by solving self-consistent solutions for two-dimensional (2D) Poisson's equations and 1D Schrodinger equations [8]. The double-gate device in this study had a 25 nm effective channel length, a 1 nm physical gate oxide thickness, and a 9 nm undoped Si (body) film. Two gates had a symmetrical (e.g., identical) near-mid-gap gate material (or work function). Physics-based device model parameters were used, so the mixed-mode simulation results are believed to have been quite representative.

Figure 5:
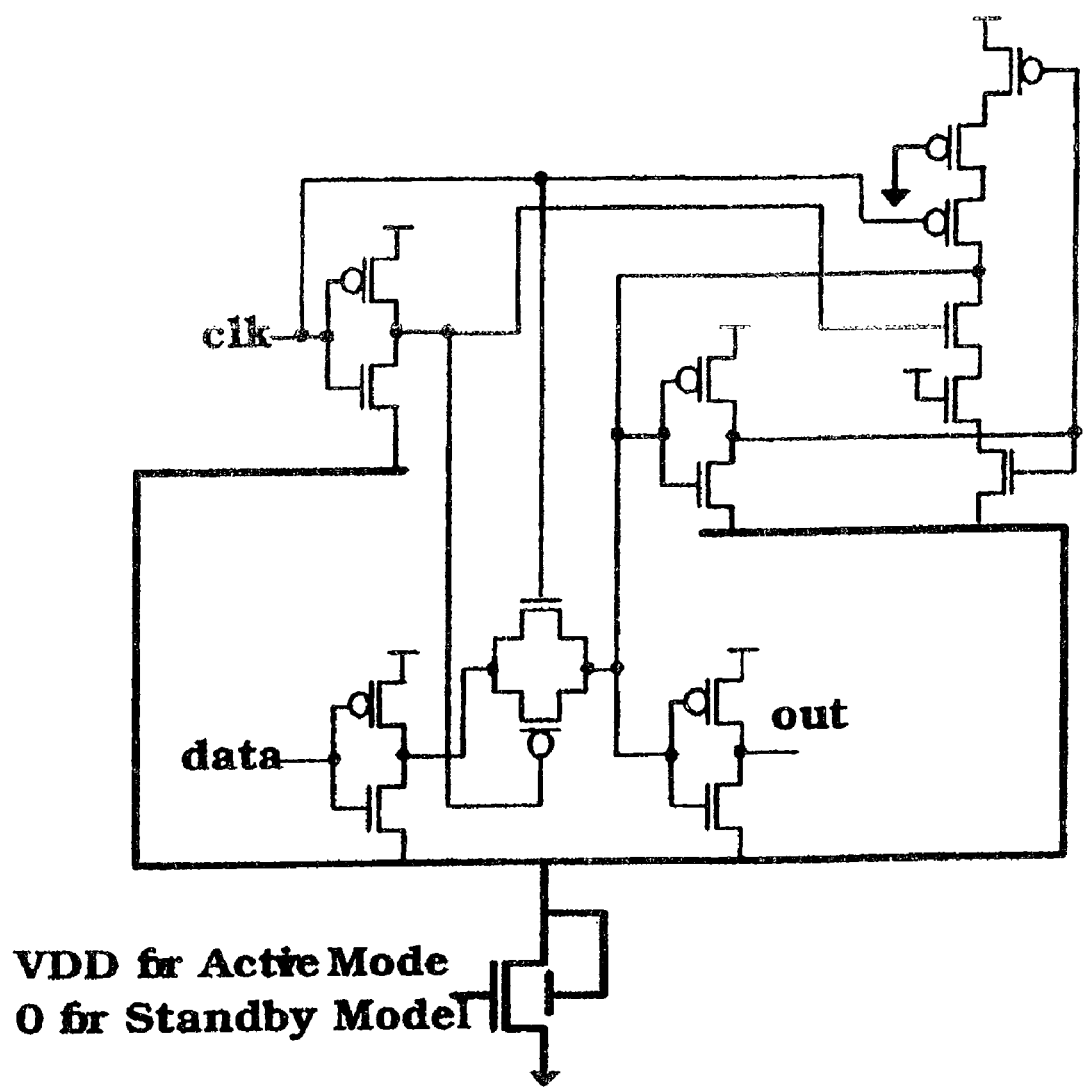
FIG. 5 schematically illustrates a latch with a power gating scheme in accordance with an embodiment of the present invention.
Figure 6:
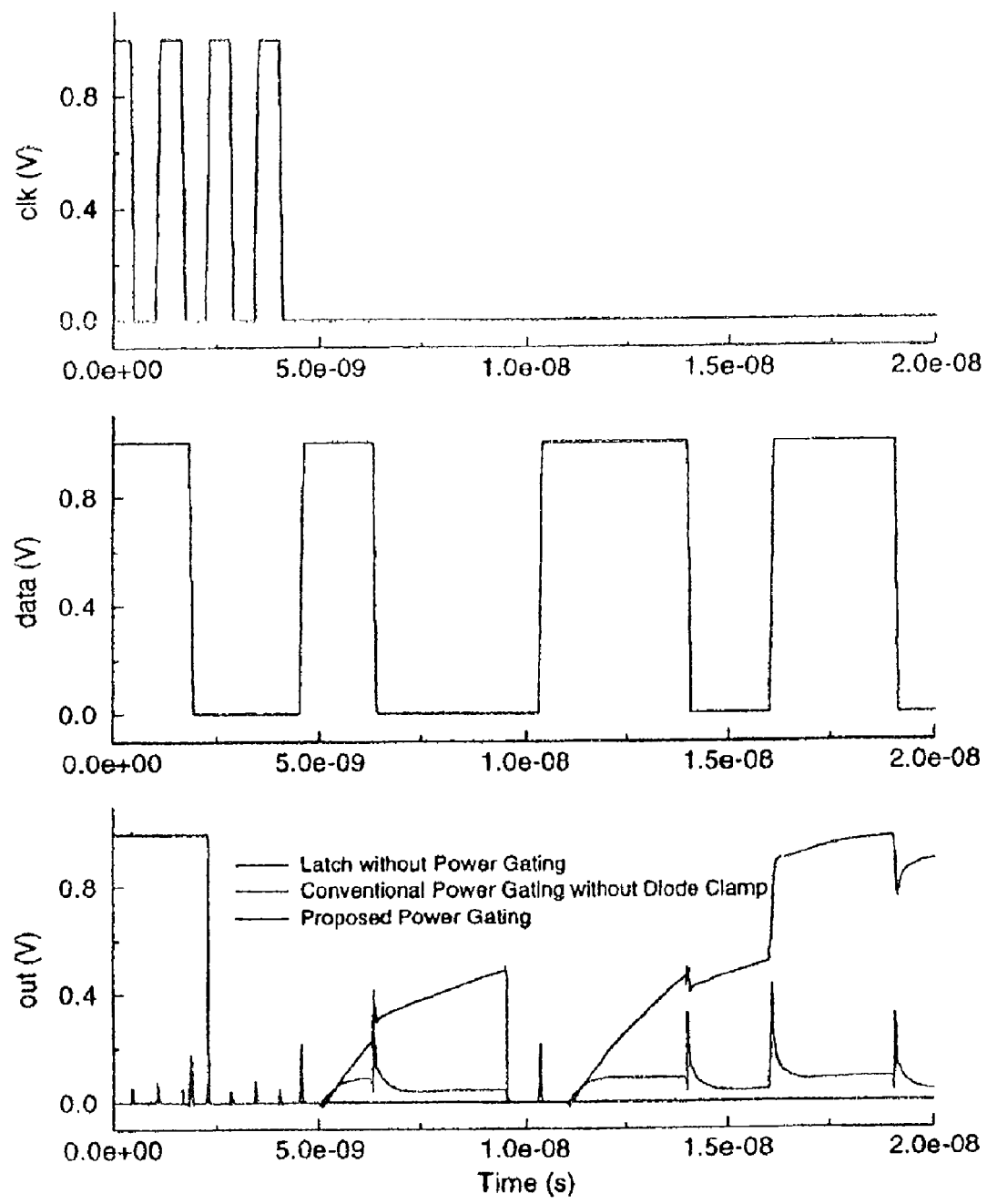
FIG. 6 graphically illustrates MEDICI-predicted results for waveforms of a latch with no power gating, conventional power gating without a diode clamp, and an inventive power gating scheme.

A derivative of a complex latch (FIG. 5) used in high-performance microprocessors was used for the simulations. FIG. 6 shows the MEDICI [8]-predicted waveforms for the proposed power gating scheme and the conventional power gating structure without the diode clamp (FIG. 1(a)). As can be seen, the conventional structure without a diode clamp cannot retain the data in the standby mode, while the scheme in accordance with at least one embodiment of the present invention does hold the data in standby mode.

Figure 7:
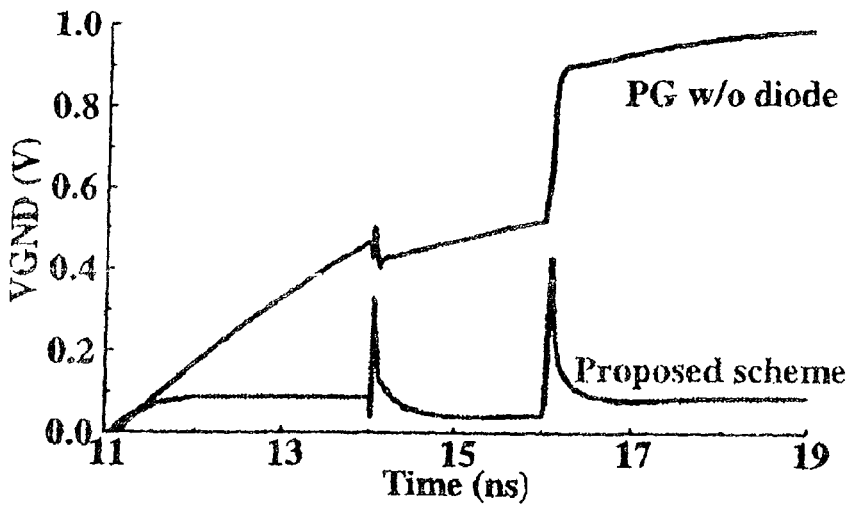
FIG. 7 graphically illustrates a MEDICI-predicted virtual GND (VGND) in the retention mode of the latch for conventional power gating without a diode clamp ("PG w/o diode clamp"), compared with an inventive scheme.

FIG. 7 compares the MEDICI-predicted virtual GND levels for these two cases. Since the virtual GND is floating for the conventional power gating structure without a clamp, it drifts asymptotically to VDD, causing the voltage across the latch to collapse and destroy the stored data. Note that the same device width (~10% of the total device width for the latch) is used for both cases.

Figure 8:
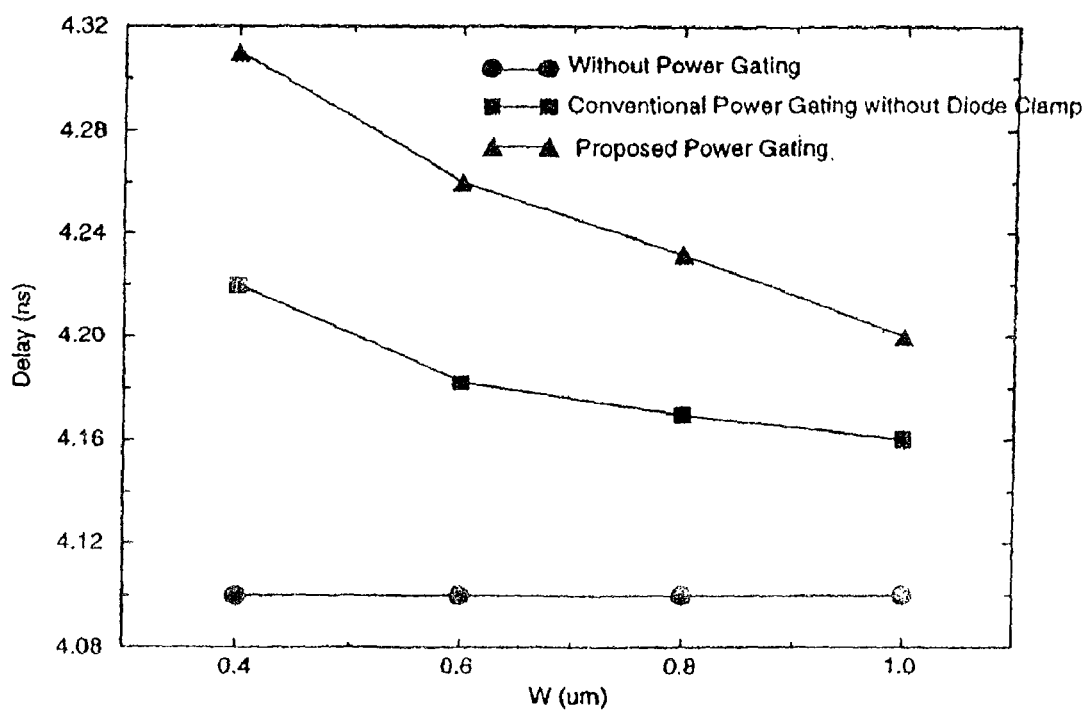
FIG. 8 graphically illustrates MEDICI-predicted delay versus power gating device width.

FIG. 8 shows MEDICI-predicted delay versus power gating device width for the two cases just described. Also shown for reference is the case with no power gating. The results show that the delay is only slightly degraded in a scheme according to an embodiment of the present invention (by ~2-5%) compared with the conventional power gating scheme without the diode clamp (which has data retention problem in standby). The total area increase for both cases is estimated to be about 4 to about 11% compared with a circuit with no power gating.

Figure 9:
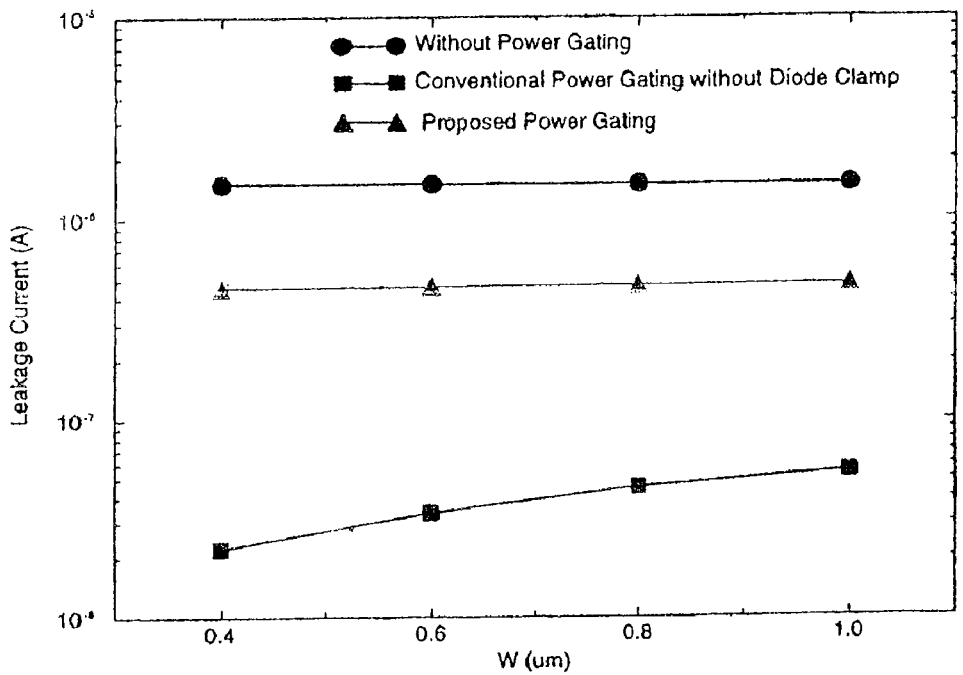
FIG. 9 graphically illustrates MEDICI-predicted leakage current versus power gating device width.

FIG. 9 shows the corresponding standby leakage current versus the power gating device width. A scheme in accordance with at least one embodiment of the present invention substantially reduces the standby leakage current of the latch circuit (by more than 3×, in fact) as compared with the case of no power gating. It should be noted that the scheme in accordance with at least one embodiment of the present invention has higher standby leakage than the conventional power gating structure without a diode clamp. This is because in the latter case, both gates for the power gating device are at ground level in standby. By contrast, in the scheme in accordance with at least one embodiment of the present invention, the diode-connected gate has its gate sitting at VGND, one diode voltage above ground.

Figure 10:
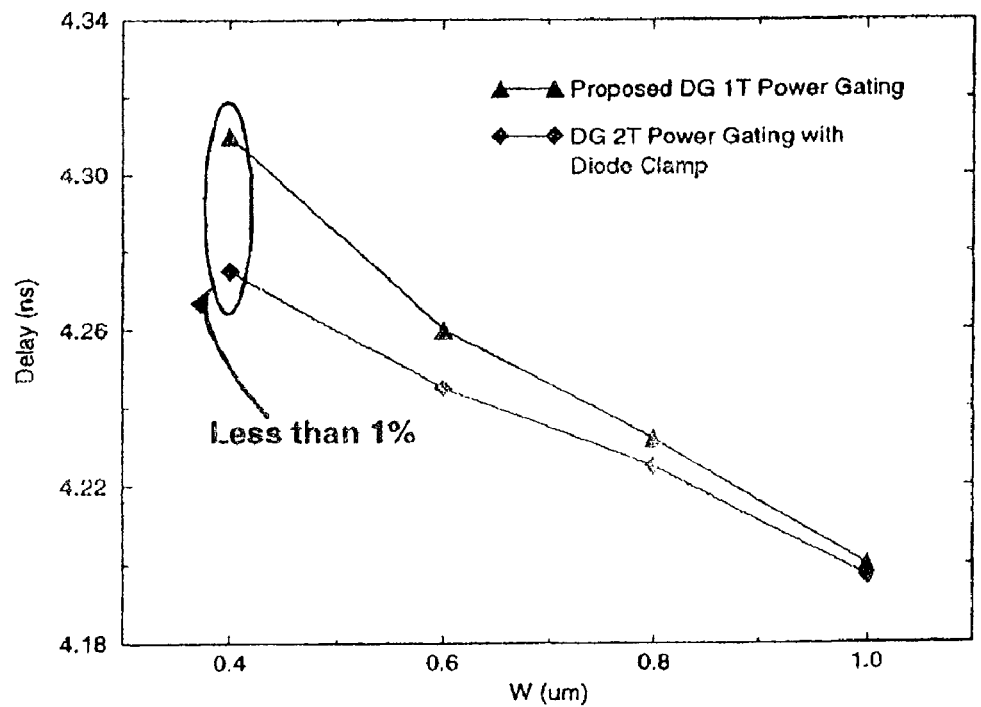
FIG. 10 graphically illustrates MEDICI-predicted delay versus power-gating device width for an inventive scheme and the conventional power-gating scheme with diode clamp using two DG devices.
Figure 11:
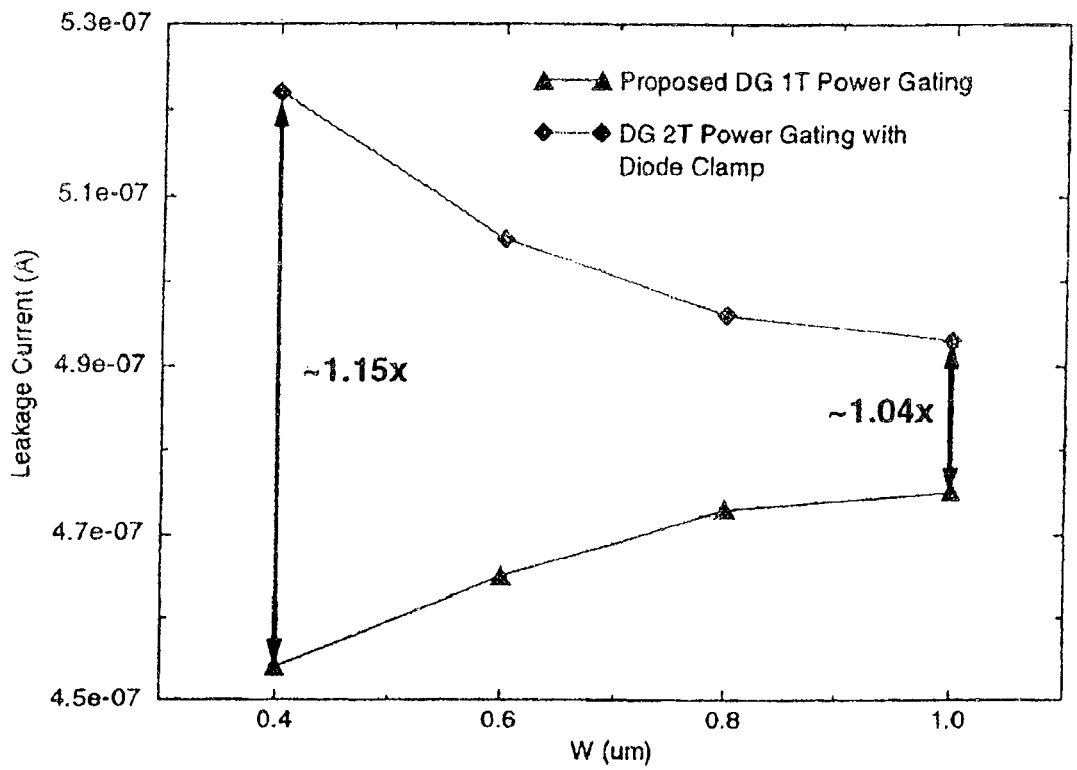
FIG. 11 graphically illustrates MEDICI-predicted leakage current versus power gating device width for an inventive scheme (1T) and the conventional power-gating scheme with diode clamp using two DG devices.

Next to be compared are the scheme in accordance with at least one embodiment of the present invention (DG 1T) with the conventional power-gating scheme with diode clamp using two DG devices (DG 2T). The DG 2T scheme uses two DG nFETs as shown in FIG. 10; one acts as the power switch with both gates tied together and the other acts as the clamping diode with both gates connected to the drain. FIGS. 10 and 11 show MEDICI-predicted delay versus power-gating device width and leakage current versus power-gating device width, respectively. Although the total device width for two power gating structures is the same, the actual area for the scheme in accordance with at least one embodiment of the present invention is smaller due to the lower number of transistors, isolations, and contacts. The scheme in accordance with at least one embodiment of the present invention shows less-than-1% speed degradation compared with the conventional DG 2T scheme, while offering leakage reduction by ~4-15% for power-gating device width W ranging from 0.4 to 1.0 μm. For larger W, relative effects of power gating structures on delay and leakage are less significant, resulting in smaller delay and leakage difference for the two cases as W increases (FIGS. 10 and 11). Hence, the scheme in accordance with at least one embodiment of the present invention offers good data retention capability and reduced leakage in sleep/standby mode, improved density, and enhanced performance in active mode.

The total leakage current for the entire latch with the DG 2T and DG 1T power gating structure, when the subthreshold leakage current is the predominant leakage component, can be expressed as:

$$I^{total}_{leakage} = W_{pg} I_o 10^{-(1+\lambda d)(VGND/S)} \quad (1)$$

where $W_{pg}$ is the total width of the power gating devices, $I_0$ is the subthreshold leakage current (per unit μm device width) when VGND is very low (close to real ground ~0.05 V), $\lambda d$ is the drain-induced barrier lowering (DIBL) factor [9-11], and S is the subthreshold swing. The increase in $W_{pg}$ causes a linear increase in leakage current. On the other hand, the voltage of VGND in sleep mode decreases when $W_{pg}$ increases due to lower series resistance for wider device, resulting in exponential decrease in the leakage current. These two effects counteract each other. Notice that the subthreshold swing S is substantially lower when both gates are tied together due to gate-to-gate coupling [10]. MEDICI simulations show that S is 65 mV/dec for the DG 2T power gating device, and 110 mV/dec for the proposed DG 1T power gating device. In DG 2T case, due to the low S, the leakage current decrease as $W_{pg}$ increases (and VGND decreases). In the DG 1T case, the higher S causes the leakage current to increase as $W_{pg}$ increases (and VGND decreases), as can be seen in FIG. 11.

Figure 12:
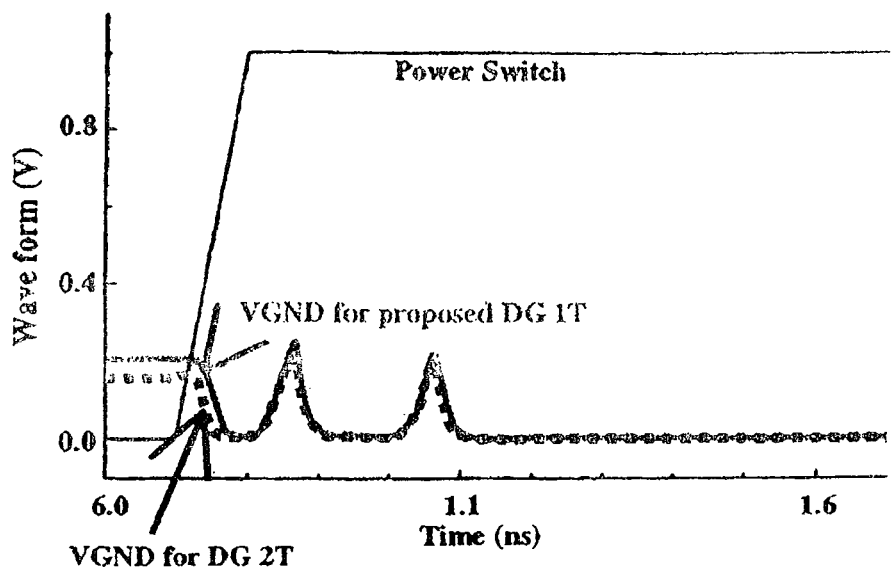
FIG. 12 graphically illustrates MEDICI-predicted ground bounce characteristics when a power switch (footer) abruptly transitions from OFF to ON for a latch with conventional power gating with diode clamp ("DG 2T") and for an inventive scheme ("DG 1T").

FIG. 12 shows MEDICI-predicted waveforms of the VGND bounce characteristics for the two cases. The scheme in accordance with at least one embodiment of the present invention exhibits a slightly higher peak voltage due to the higher $V_T$ in single-gate mode of operation. The ground rail stabilization times are almost identical for the two cases.

Figure 13:
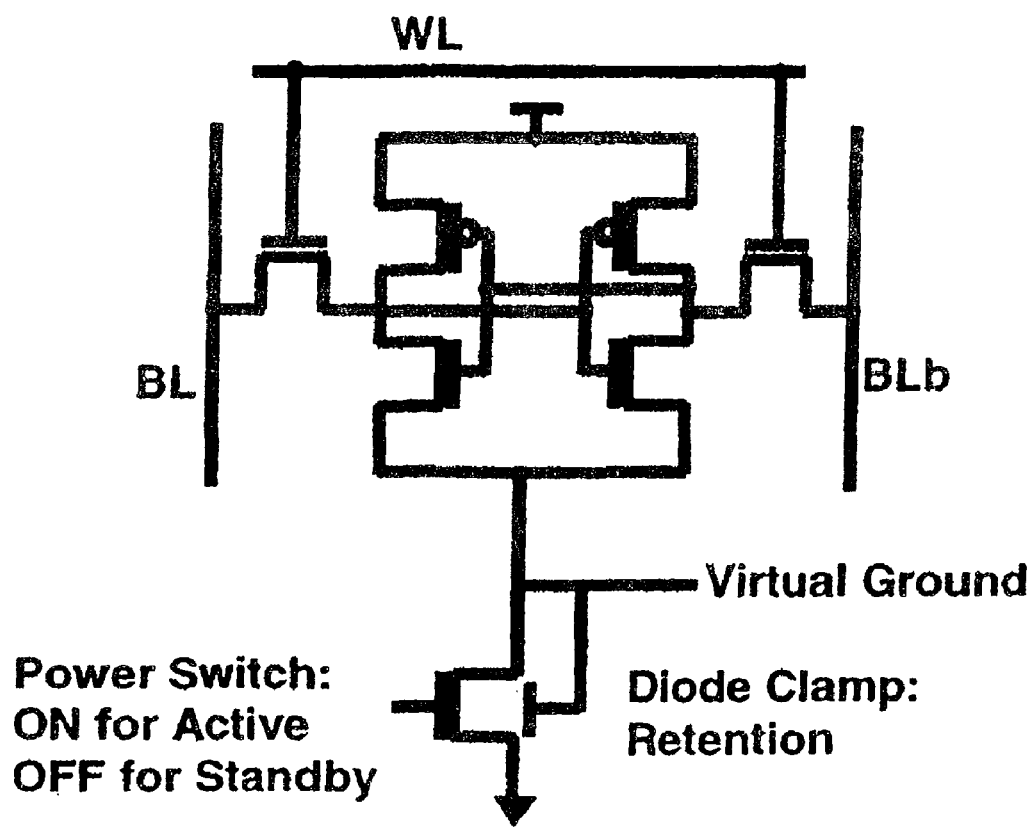
FIG. 13 schematically illustrates double-gate attributes applied to a SRAM cell in accordance with an embodiment of the present invention.
Figure 14:
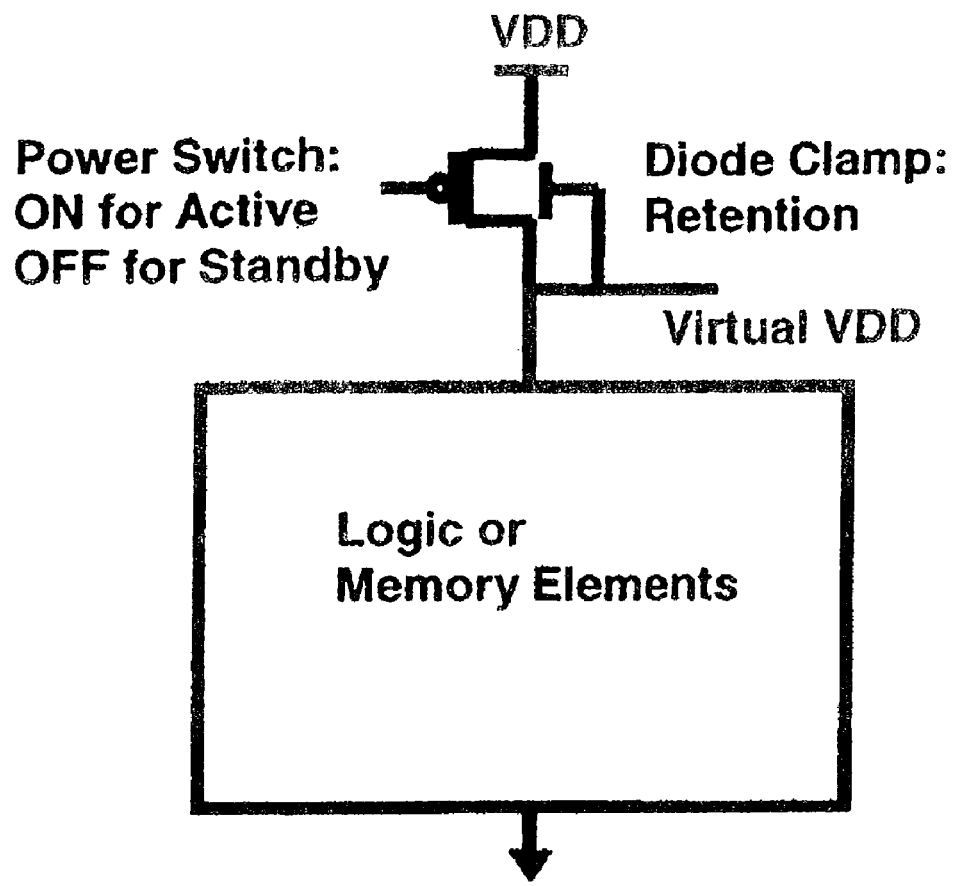
FIG. 14 schematically illustrates double-gate attributes applied to a power gating header structure in accordance with an embodiment of the present invention.

In accordance with a variant embodiment of the present invention, as shown in FIG. 13, the double-gate attributes discussed hereabove may be applied to a SRAM cell. Particularly, FIG. 13 shows a high-density low-power data retention power gating structure using a single 4-terminal double-gate device with separate gates for conventional 6T SRAM cell. Furthermore, it is also conceivable to apply the double-gate attributes discussed hereabove to a header structure as shown in FIG. 14. Particularly, FIG. 14 shows a high-density low-power data retention power gating header structure using a single 4-terminal double-gate pMOS device with separate gates. The drain of the pFET is tied to virtual VDD.

It is to be understood that the double-gate attributes discussed hereabove can be applied to an even wider range of possible applications. For instance, the double-gate attributes discussed hereabove can be employed in essentially any technology involving independently controlled front- and back-gates. Environments for the employment of such attributes may include, but are by no means limited to, bulk MOSFET with an isolated body, silicon-on-insulator (SOI) MOSFET with a body-tied source or drain, hybrid orientation technology (HOT) with a floating body either for bulk Si or ultra-thin SOL and double-gate devices such as a planar double-gate device, FinFET, or Trigate.

By way of recapitulation, there are proposed herein power gating schemes using a single DG device to serve both power gating switch and supply/ground rail clamping diode functions. It offers robust data retention, minimizes area/capacitance penalty, reduces standby leakage, and improves the performance and power. Extensive mix-mode simulations demonstrate/validate the advantage of the scheme in accordance with at least one embodiment of the present invention. The proposed power gating structure can be widely applied to high-performance low-power memory and logic using a single footer or header. The supply/ground bounce is essentially comparable to the conventional power-gating structure with a clamping diode.

If not otherwise stated herein, it is to be assumed that all patents, patent applications, patent publications and other publications (including web-based publications) mentioned and cited herein are hereby fully incorporated by reference herein as if set forth in their entirely herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

REFERENCES

[1] T. Sakurai, "Low power digital circuit design," *ESSCIRC*, pp. 11-18, Sep. 2004.
[2] Y. Kurihara, Y. Yamagata, and T. Ikarashi, "Temperature compensation AGC circuit with temperature characteristic of AGC voltage," U.S. Pat. No. 6,359,498, May 19, 2002.
[3] S. Kim, et al., "Experimental measurement of a novel power gating structure with intermediate power saving mode," *ISLPED*, pp. 20-25, August 2004.
[4] E. Nowak, et al., "Turning Silicon on its edge," *IEEE Circuits Devices Mag.*, pp. 20-31, January/February 2004.
[5] M.-H. Chiang, et al., "Novel high-density low-power high-performance double-gate logic techniques," *Proc. IEEE Int. SOI Conf.*, pp. 122-123, October 2004.
[6] K. W. Guarini et al., "Triple-self-aligned, planar double-gate MOSFETs: devices and circuits," IEDM, pp. 425-428, December 2001.
[7] Y. Liu, et al., "A high threshold voltage-controllable 4T FinFET with an 8.5-nm-thick Si-Fin channel, *IEEE Elec. Dev. Lett.*, pp. 510-512, July 2004.
[8] Taurs-MEDICI, Synopsis, Inc., 2003.
[9] Y. Taur and T. H. Ning, Fundamentals of modern VLSI devices, *NY: Cambridge Univ. Press,* 1998.
[10] K. Kim, et al., "Nanoscale CMOS circuit leakage power reduction by double-gate device, *ISLPED*, pp. 102-107, August 2004.
[11] S. Narendra, et al., "Scaling of stack effect and its application for leakage reduction," *ISLPED*, pp. 195-200, August 2001.

What is claimed is:

1. An apparatus comprising:
   circuitry to be power-gated;
   a transistor configured to operate as a switch having a double gating arrangement, said transistor comprising two gates, a first drain-source terminal, and a second drain-source terminal, a first of the two gates being configured to perform a power switch function, a second of the two gates being configured to perform a clamping function, said first drain-source terminal being coupled to said circuitry to be power-gated; and
   a voltage supply coupled to said first and second gates, said voltage supply being configured to:
   activate said first gate to turn said transistor ON in an active mode;
   deactivate said first gate in a standby mode;

deactivate said second gate in said active mode; and
activate said second gate to perform said clamping function in said standby mode;
wherein said second of the two gates is electrically interconnected with said first drain-source terminal to form one of a virtual ground and a virtual voltage supply.

2. The apparatus according to claim 1, whereby:
data retention capability in a sleep or standby mode is improved; and
leakage is reduced.

3. The apparatus according to claim 1, whereby an area/capacitance penalty is minimized.

4. The apparatus according to claim 1, whereby supply/ground bounce is comparable to a conventional power-gating structure with a clamping diode.

5. The apparatus according to claim 1, wherein said circuitry to be power-gated comprises an SRAM cell.

6. The apparatus according to claim 1, wherein said transistor is controlled by said voltage supply to function as one of a power gating header structure and a power gating footer structure to said circuitry to be power-gated.

7. The apparatus according to claim 1, wherein said transistor further comprises a silicon conducting channel and wherein said first gate and said second gate are located on opposite sides of said channel.

8. The apparatus of claim 1, wherein said first gate creates a first channel when activated and wherein said second gate creates a second channel when activated.

9. A method comprising the steps of:
providing a transistor configured to operate as a switch having a double gating arrangement, said transistor comprising two gates, a first drain-source terminal, and a second drain-source terminal, said first drain-source terminal being coupled to circuitry to be power-gated;
performing a power switch function on said circuitry to be power-gated with a first of said two gates, by activating said first gate to turn said transistor ON in an active mode and deactivating said first gate in a standby mode; and
performing a clamping function, independent of the power switch function, on said circuitry to be power-gated with the second of said two gates, by deactivating said second gate in said active mode and activating said second gate to perform said clamping function in said standby mode;
wherein said second of the two gates of said transistor provided in said providing step is electrically interconnected with said first drain-source terminal to form one of a virtual ground and a virtual voltage supply.

10. The method according to claim 9, whereby:
data retention capability in a sleep or standby mode is improved; and
leakage is reduced.

11. The method according to claim 9, whereby an area/capacitance penalty is minimized.

12. The method according to claim 9, whereby supply/ground bounce is comparable to a conventional power-gating structure with a clamping diode.

13. The method according to claim 9, wherein said circuitry to be power-gated comprises an SRAM cell.

14. The method according to claim 9, wherein said transistor is controlled by said voltage supply to function as at least one of a power gating header structure and power gating footer structure.

15. The method according to claim 9, wherein said transistor provided in said providing step further comprises a silicon conducting channel and wherein said first gate and said second gate are located on opposite sides of said channel.

16. The method of claim 9, wherein said first gate of said transistor provided in said providing step creates a first channel when activated and wherein said second gate of said transistor provided in said providing step creates a second channel when activated.

* * * * *